United States Patent [19]
Pare et al.

[11] Patent Number: 5,774,335
[45] Date of Patent: Jun. 30, 1998

[54] HEAT SINK ASSEMBLY WITH HEIGHT ADJUSTABLE MOUNTING CLIP

[75] Inventors: Rodney H. Pare, West Warwick; William B. Rife, Greenville, both of R.I.

[73] Assignee: Chip Coolers, Inc., Warwick, R.I.

[21] Appl. No.: 833,660

[22] Filed: Apr. 8, 1997

[51] Int. Cl.[6] .................................................. H05K 7/20
[52] U.S. Cl. ........................ 361/704; 361/690; 361/694; 361/695; 361/707; 361/717; 361/718; 257/718; 257/719
[58] Field of Search .................................... 361/704, 697, 361/702, 703, 717, 718; 257/718, 719

[56] References Cited

U.S. PATENT DOCUMENTS

| | | | |
|---|---|---|---|
| 2,916,159 | 12/1959 | O'Neill | 211/89 |
| 3,033,537 | 5/1962 | Brown, Jr. | 257/263 |
| 3,229,756 | 1/1966 | Keresztury | 165/67 |
| 4,345,267 | 8/1982 | Corman et al. | 357/81 |
| 4,607,685 | 8/1986 | Mitchell, Jr. | 165/80.3 |
| 4,660,123 | 4/1987 | Hermann | 361/386 |
| 4,745,456 | 5/1988 | Clemens | 357/79 |
| 5,313,099 | 5/1994 | Tata et al. | 257/717 |
| 5,397,919 | 3/1995 | Tata et al. | 257/717 |

FOREIGN PATENT DOCUMENTS

| | | |
|---|---|---|
| 0 130 279 | 3/1984 | European Pat. Off. . |
| 29516627U1 | 1/1996 | Germany . |
| 58-176959A | 12/1982 | Japan . |

*Primary Examiner*—Leo P. Picard
*Assistant Examiner*—Boris L. Chervinsky
*Attorney, Agent, or Firm*—Barlow & Josephs, Ltd

[57] ABSTRACT

A heat sink assembly with an adjustable and customizable mounting clip is provided. The legs of the mounting clip are adjustable to accommodate heat sink members of different sizes and shapes. The overall height of the mounting clip is adjustable by selecting a particular radial flange for mounting to a flange seat on a universal top member. With the leg length selected, unwanted portions of the legs may be snapped off and discarded to leave a customized, low-profile heat sink assembly.

15 Claims, 6 Drawing Sheets

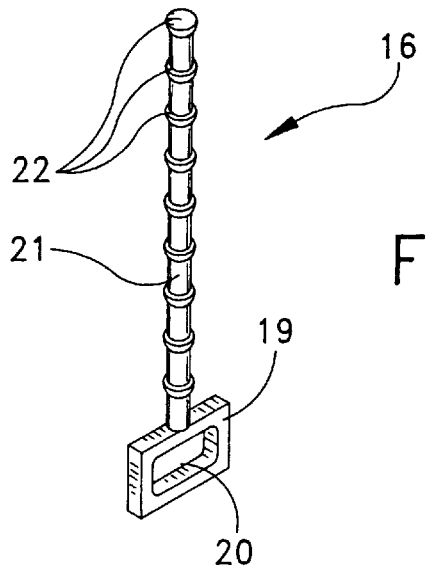
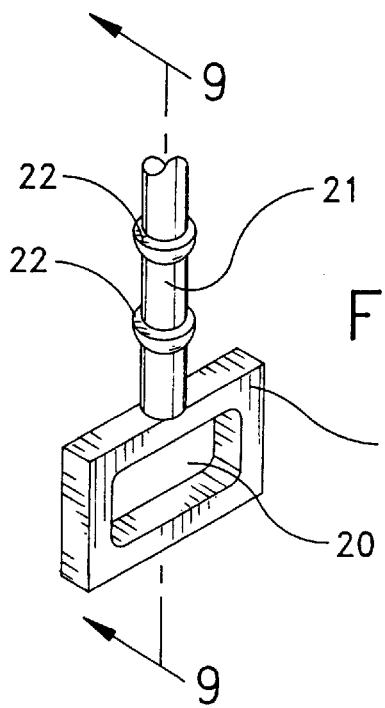
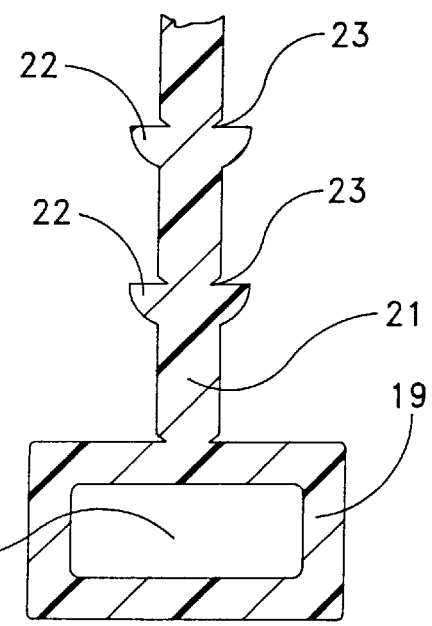

HEAT SINK ASSEMBLY WITH HEIGHT ADJUSTABLE MOUNTING CLIP

BACKGROUND OF THE INVENTION

The present invention relates generally to electronic solid state and integrated circuit devices. More specifically, the present invention relates to apparatuses for dissipating heat generated by such devices.

In the electronics and computer industries, it has been well known to employ various types of electronic device packages and integrated circuit chips, such as the PENTIUM central processing unit chip (CPU) manufactured by Intel Corporation and RAM (random access memory) chips. These integrated circuit chips are typically installed into a socket which is soldered to a computer circuit board, also known as a motherboard. These integrated circuit devices, particularly the CPU microprocessor chips, generate a great deal of heat during operation which must be removed to prevent adverse effects on operation of the system into which the device is installed. For example, a PENTIUM microprocessor containing millions of transistors is highly susceptible to overheating which could destroy the microprocessor device itself or other components proximal to the microprocessor.

Microprocessor chips, such as the PENTIUM, are typically installed in a zero insertion force (ZIF) socket which is soldered directly to the motherboard of a computer. The ZIF socket has become increasingly popular over the years because it can easily accommodate complex integrated circuit chips without fear of damaging the chip itself or the downwardly depending pins which provide the electrical contact from the microprocessor to the motherboard. A ZIF socket includes a release handle which, when open, permits easy installation of the microprocessor into the socket. Subsequent closure of the handle secures the microprocessor in place.

In light of the known heat problems associated with microprocessors, ZIF socket manufacturers have provided protrusions emanating from opposing sides of the ZIF socket to enable heat sink assembly manufacturers to more easily affix their heat sink assemblies to a microprocessor installed in the ZIF socket. It has been well known in the art for heat sink assembly manufacturers to provide mounting clips which span across the ZIF socket to engage with the emanating protrusions to facilitate securing a metal heat sink member into flush thermal communication with the microprocessor.

However, these known assemblies, which connect to the ZIF protrusions, cannot be adjusted or customized. The increasing number of ZIF socket manufacturers in response to an exploding demand for computer component parts, results in a wide array of product components on the market. Sizes, shapes and configurations of the actual heat sink member vary widely necessitating a custom clip member to be provided for maintaining the heat sink member in flush thermal communication with a heat generating source, such as a semiconductor device.

In particular, extruded block heat sinks of differing heights are employed depending on the application. When there is a demand for a large heat sink member with tall fin members, such as for a PENTIUM processor in a Network Server computer which runs 24 hours a day, an appropriate clip must be provided to accommodate the taller height of the heat sink member. In a laptop computer, for example, a lower profile heat sink member is required due to space considerations. As a result, a custom retaining clip is required to accommodate the low profile heat sink so it may be properly maintained in thermal communication with the PENTIUM processor. Different retaining clips must be used to accommodate heat sinks of differing heights even though the actual footprints of the heat sinks are the same.

In addition, the protrusions emanating from the ZIF socket are not always located in the same position from manufacturer to manufacturer. In addition, universal-type mounting clips for heat sink assemblies are often not adequate because unused portions of the clip, which may be used in a clip from another manufacturer, many obstruct other component parts on the motherboard, particularly in low-profile computer case designs.

In view of the foregoing, there is a demand for a heat sink assembly which can be easily customized to adapt to a wide array of heat sink heights and ZIF sockets for a particular microprocessor. It is also desirable for a heat sink assembly to be customizable and adjustable without obstructing or interfering with motherboard design or computer component layout. It is also desirable for such an adjustable heat sink assembly to be easily securable to a ZIF socket without the need for additional tools.

SUMMARY OF THE INVENTION

The present invention preserves the advantages of prior art heat sink assemblies for integrated circuit devices, such as microprocessors. In addition, it provides new advantages not found in currently available assemblies and overcomes many disadvantages of such currently available assemblies.

The invention is generally directed to the novel and unique heat sink assembly with particular application in cooling microprocessor integrated circuit devices, such as a PENTIUM processor. The heat sink assembly of the present invention enables the simple, easy and inexpensive assembly, use and maintenance of a heat sink assembly while realizing superior heat dissipation.

The preferred embodiment of the present invention includes a universal top member with a first end and a second end opposing the first end. A number of first fork members are connected to an emanate outwardly from the first end of the top member. A second group of fork members are connected to and emanate outwardly from the second end of the top member. A first adjustable leg is removably connected to one of the first fork members and downwardly depends therefrom. The first leg includes an elongated shaft member with an upper end and bottom end and a number of spaced apart radial flanges along its length. A first enclosed loop is affixed to the bottom end of the shaft member which is engageable with one of the protrusions emanating from the socket into which the electronic device package to be cooled is installed. The first leg is removably connected to the first end of the top member via engagement of one of the radial flanges with the fork member. The second leg is similarly removably connected to the opposing second side of the top member for engagement with a selected one of the protrusions emanating from the socket on the opposite side of the first set of protrusions. In addition, a heat sink is disposed in flush communication with the electronic device package. The top member engages with the heat sink member to maintain the heat sink member in flush thermal communication with the electronic device package. Connection of the first end of the top member to a selected one of the radial flanges on the first leg and connection of the second end of the top member to a selected one of the radial flanges on the second leg to define a distance between the top member and the electronic device package to accommodate the heat sink member.

In operation, the heat sink member and the top member are placed over the electronic device package so the flat bottom surface of the heat sink member is in flush thermal communication with the electronic device package. On each side of the top planar member, one of the fork members is selected for receipt of an adjustable leg. The appropriate radial flange of each adjustable leg is placed on a predetermined fork member to, thereby, define the height of the adjustable leg. The bottom enclosed loop of each adjustable leg is placed over the corresponding protrusion emanating from the ZIF socket. The heat sink member is then screwed down through the top member to tighten the overall structure in place.

It is therefore an object of the present invention to provide a heat sink assembly with an adjustable mounting clip which can accommodate heat sink members of varying heights.

Another object of the present invention is to provide a heat sink assembly which can be customized to mount to custom selected protrusions emanating from a socket.

It is a further object of the present invention to provide a heat sink assembly which can be easily customized to accommodate various types of motherboard layouts and the position of various components thereon.

It is yet a further object of the present invention to provide a heat sink assembly which is easy to install yet still providing superior heat dissipating results.

BRIEF DESCRIPTION OF THE DRAWINGS

The novel features which are characteristic of the present invention are set forth in the appended claims. However, the inventions preferred embodiments, together with further objects and attendant advantages, will be best understood by reference to the following detailed description taken in connection with the accompanying drawings in which:

FIG. 7 is a perspective view of an adjustable leg in accordance with the present invention;

FIG. 8 is a close-up perspective view of the adjustable leg shown in FIG. 7;

FIG. 9 is a cross-sectional view through the line 9—9 of FIG. 8;

DETAILED DESCRIPTION OF THE PREFERRED EMBODIMENT

Figure 1:
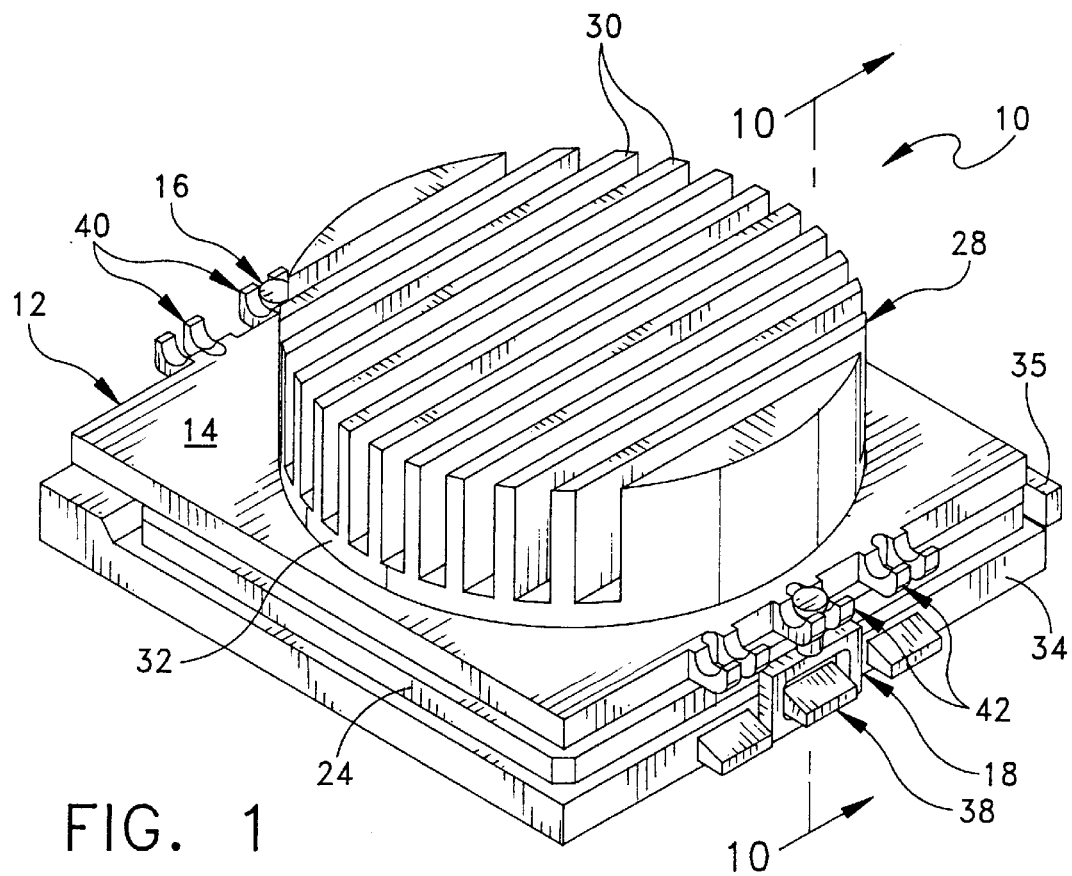
FIG. 1 is a perspective view of a heat sink assembly installed on a socket carrying an electronic device package and employing the adjustable mounting clip in accordance with the present invention.

Referring to FIG. 1, a perspective view of the heat sink assembly 10 of the present invention is shown installed on an integrated circuit socket 34 carrying an electronic device package 24. More specifically, FIG. 1 illustrates the installation of heat sink assembly 10 of the present invention on a zero insertion force (ZIF) socket carrying a microprocessor chip, such as a PENTIUM processor, generally referred to as electronic device package 24. The drawings are illustrative of use of the heat sink assembly 10 of the present on a ZIF socket carrying a PENTIUM processor; however, the heat sink assembly 10 can be employed for dissipating heat from many different types of integrated circuit chips installed on a wide array of sockets. The use of the present invention on a ZIF socket is an example of the many applications of the heat sink assembly 10 of the present invention. For ease of illustration, the present invention is shown and described in connection with a ZIF socket and PENTIUM processor installed therein.

FIG. 1 shows heat sink assembly 10 of the present invention installed on ZIF socket 34 via socket protrusion 38b emanating laterally therefrom. The heat sink assembly 10 includes adjustable mounting clip 12 and a heat sink member 28.

FIG. 1 shows heat sink assembly 10 of the present invention installed on ZIF socket 34 via left socket protrusion 36b and right socket protrusion 38b emanating laterally therefrom. The heat sink assembly 10 includes adjustable mounting clip, generally referred to as 12, and heat sink member 28 with fins 30 emanating from base 32. Referring to both FIGS. 1 and 2, planar member 14 is provided with a number of left fork members 40 emanating from one of its ends while also providing a number of right fork members 42 emanating from the opposing end from where left fork members 40 reside. Downwardly depending from planar member 14 is left adjustable leg 16 and right adjustable leg 18. Adjustable legs 16 and 18 are removably connected to planar member 14 via fork members 40 and 42 to permit selective engagement with selected protrusions 36b and 38b from ZIF socket 34.

Figure 2:
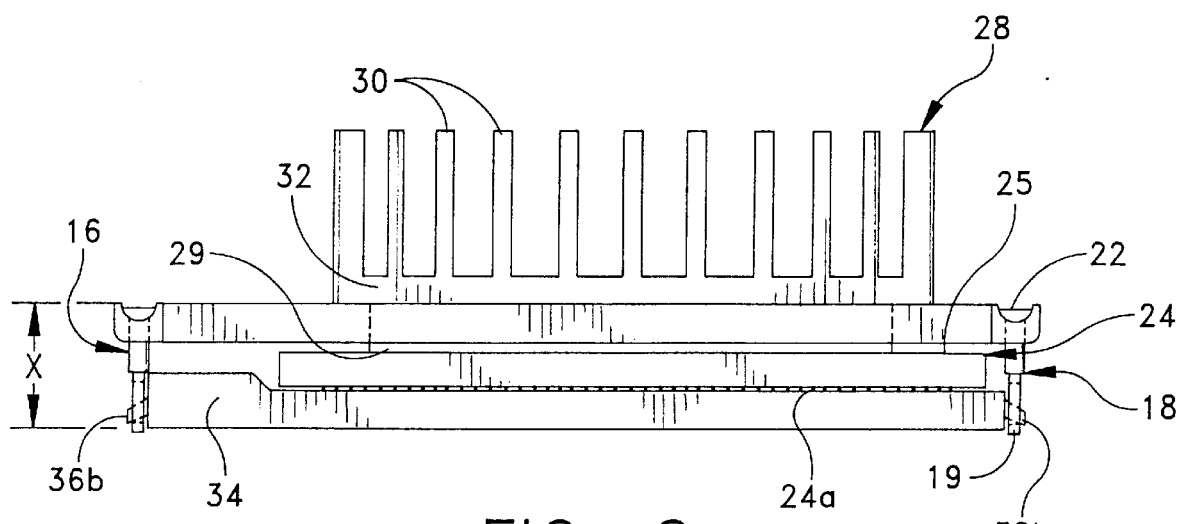
FIG. 2 is a front view of the heat sink assembly of FIG. 1.
Figure 3:
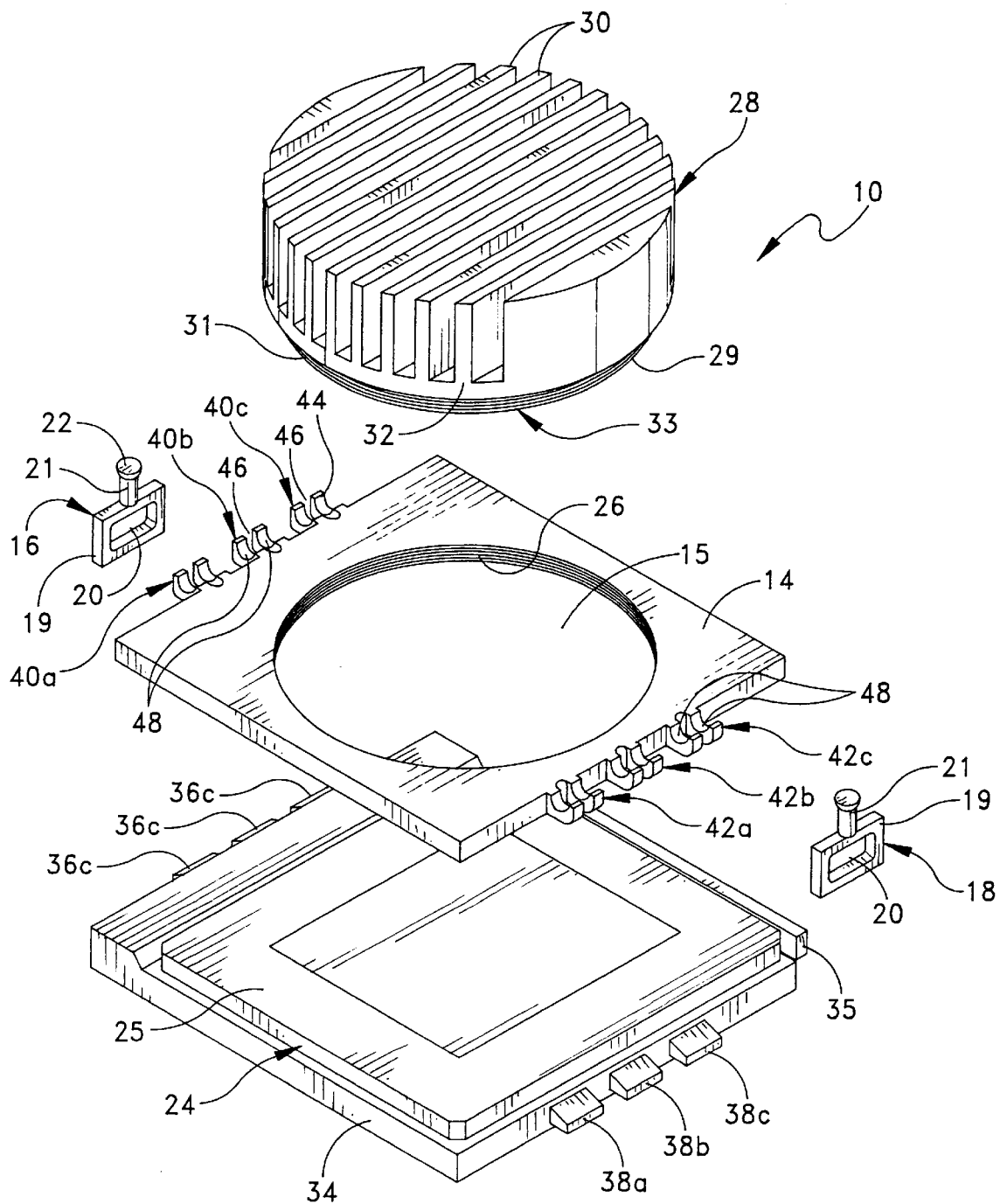
FIG. 3 is an exploded perspective view of the heat sink assembly of in FIG. 1.
Figure 10:
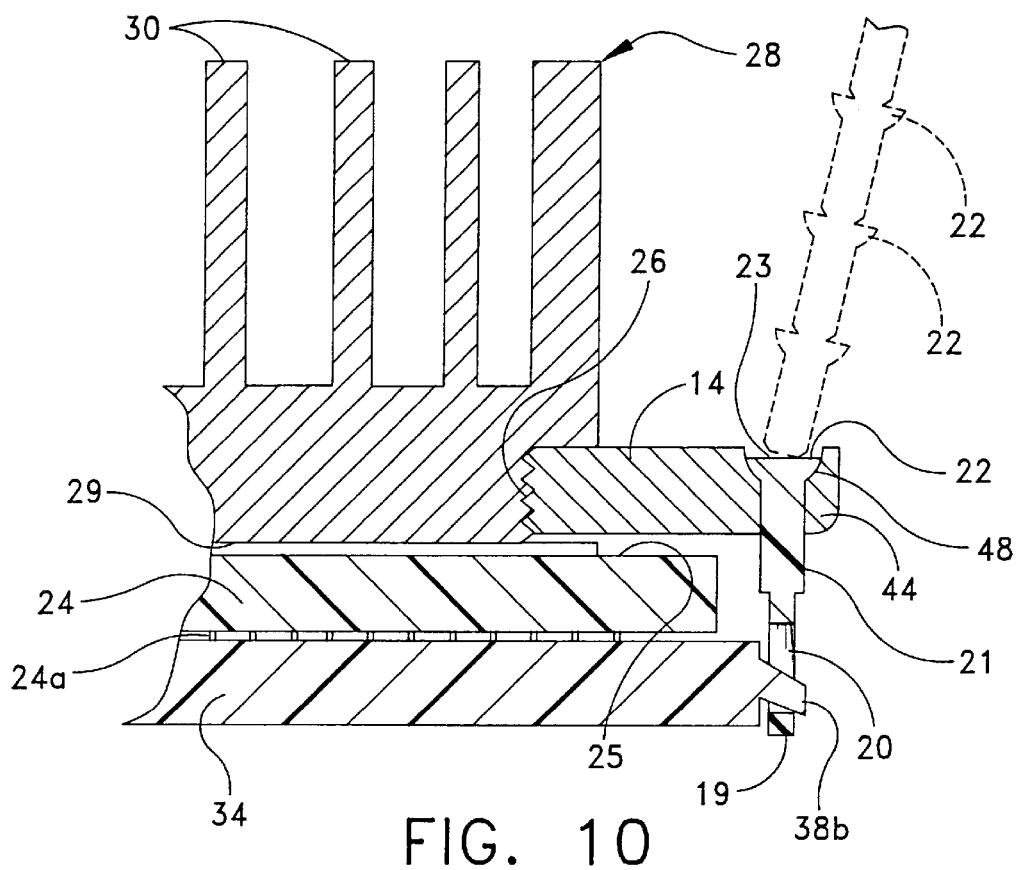
FIG. 10 is a cross-sectional view through the line 10—10 of FIG. 1 illustrating customization of the adjustable leg shown in FIG. 8.

As in FIGS. 3 and 10, heat sink member 28 is threadably receivable through bore 15 in planar member 14 to enable bottom surface 29 of heat sink member 28 to become in flush communication with top surface 25 of electronic device package 24 installed in socket 34 via pins 24a which is seen best in FIG. 2. Male threads 31 threadably engage with female threads 26 about bore 15.

FIG. 2 illustrates the advantages of a heat sink assembly with a mounting clip which is height adjustable. In particular, length "x" may be easily adjusted as needed for the particular application at hand. Most importantly, the length of legs 16 and 18 can be adjusted to accommodate the specific type and configuration of heat sink employed. In the preferred embodiment shown in FIGS. 1–11, a cylindrical threaded heat sink 28 is employed which includes a number of upstanding fins 30 emanating from a base 32. In this cylindrical heat sink 28, threads 31 are provided on a heat sink base, generally referred to as 33. According to the application, it may be desirable to include a very tall base 33 which raises planar member 14 farther away from ZIF socket 34 thus necessitating longer legs. As shown in the alternative embodiment of FIGS. 12 and 13, which will be discussed in more detail below, the universal-type planar member 14 may be employed to accommodate a wide array of heat sink sizes and configuration with the use of legs 16 and 18 of the present invention.

Turning back to FIG. 3, an exploded perspective view of the present invention installed on a PENTIUM processor in a ZIF socket, is shown. On one end of planar member 14 is a number of left fork members 40a, 40b, and 40c. On the opposing end thereof, right fork members 42a, 42b, and 42c are also provided.

Figure 4:
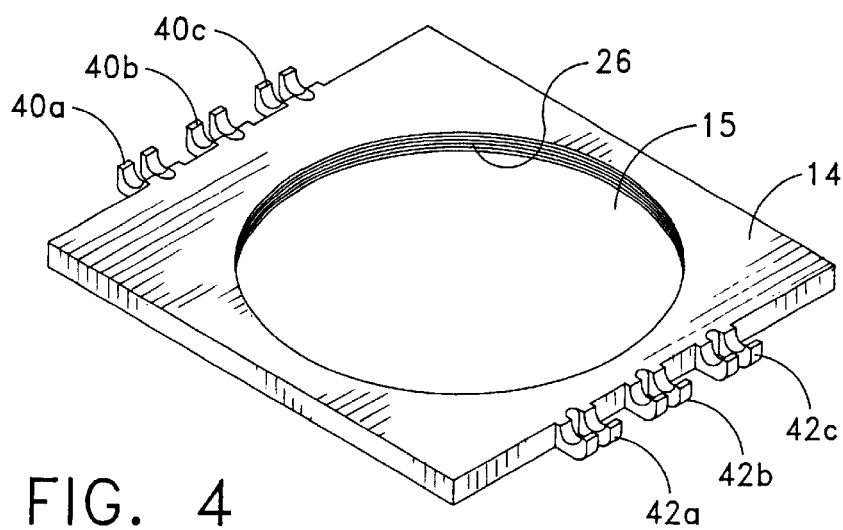
FIG. 4 is a perspective view of the top planar member of the adjustable mounting clip in accordance with the present invention.
Figure 5:
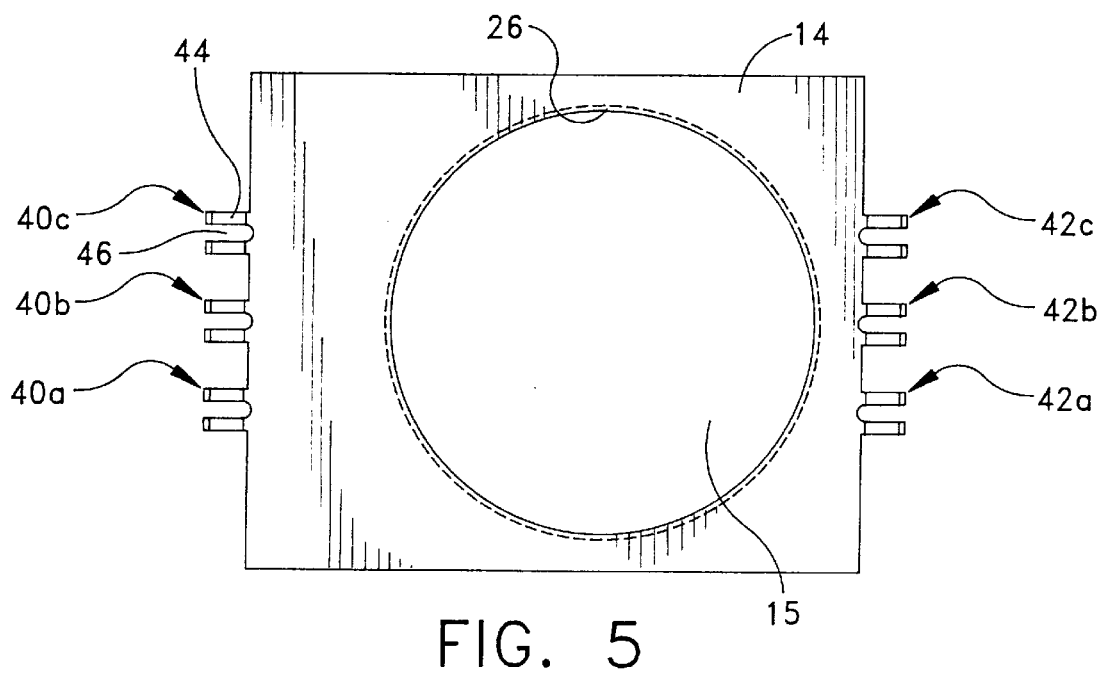
FIG. 5 is a top view of the top planar member shown in FIG. 4.
Figure 6:
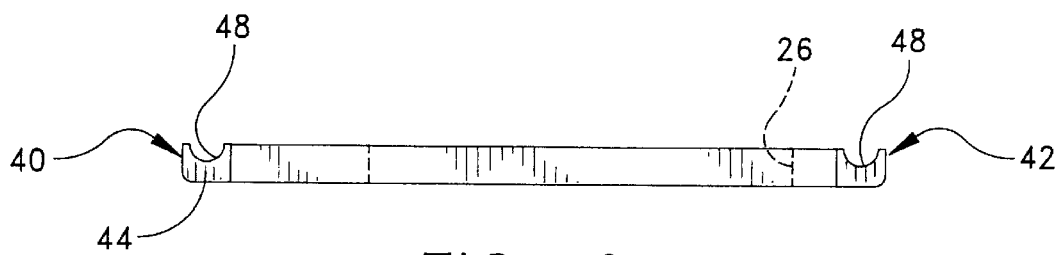
FIG. 6 is a front view of the top planar member shown in FIG. 4.

ZIF socket 34 includes left socket protrusion 36a, 36b, and 36c while, on the opposing end thereof, right socket protrusions 38a, 38b, and 38c are also provided. Fork members 40a, 40b, and 40c are generally arranged and emanating from planar member 14 to align with the most common locations of protrusions 36a, 36b, and 36c, emanating from ZIF protrusion 34. Similarly, fork members 42a, 42b, and 42c are arranged to align with the locations of ZIF protrusions 38a, 38b, and 38c. As will be discussed in connection with FIG. 11 below, if one of the ZIF protrusions, generally referred to as 36 and 38, are missing or are obstructed, one of the other protrusions may be employed to secure the heat sink assembly to the electronic device package 24. FIG. 4 further shows a perspective view of planar member 4 with fork members 40 and 42 emanating therefrom. FIG. 5 illustrates a top planar view of top planar member 14 while FIG. 6 shows a front view thereof.

Referring now to FIGS. 3, 7, 8, and 9, details of the adjustable legs 16 and 18, of the present invention, are shown in detail. Adjustable legs 16 and 18 are identical and are preferably provided on opposing sides of planar member 14. For ease of illustration, only adjustable leg 16 will be discussed. As seen in FIG. 3, adjustable leg 16 includes shaft 21, radial flange 22 and enclosed loop 19 with loop aperture 20 therethrough. Shaft 21 is placed into fork aperture 46 so that radial flange 22 may reside on flange seat 48 to provide enclosed loop 19 therebelow. In the event adjustable leg 16 is installed on fork member 40b, enclosed loop 19 is placed over ZIF protrusion 36b. Height adjustable leg 18 is similarly installed on the opposing side of the ZIF socket. Upon installation of adjustable legs 16 and 18 and engagement of protrusions 36b and 38b, heat sink member 28 is threaded into and through planar member 14 via bore 15 which urges legs 16 and 18 upwards thus causing the bottom wall of apertures 20 in the adjustable legs 16 and 18 to be snugly secured below protrusions 36b and 38b, respectively. As a result, the entire heat sink assembly is safely secured to ZIF socket 34 with electronic device package sandwiched therebetween.

Turning now specifically to FIG. 7-9, an adjustable leg, prior to installation and customization, is shown. Preferably, adjustable leg 16 has an overall length of approximately two inches with an elongated shaft 21 having a number of spaced apart radial flanges emanating therefrom. Enclosed loop 19, with aperture 20 therethrough, is provided on the bottom end of shaft 21. Spaced apart flanges 22 may be a quarter of an inch apart from one another, for example, or may be at other distances in accordance with the required application. As can be seen in FIG. 2, for example, the distance between radial flange 22 and enclosed loop 19 define the leg height needed for proper adjustment of the heat sink assembly. The inclusion of a number of spaced apart radial flanges enable the adjustable leg height to be easily selected and implemented by placing the desired radial flange 22 on the appropriate flange seat 48. For example, the heat sink assembly 10 requires very short legs 16 and 18, thus the lowermost radial flange 22 is employed. Portions of the adjustable leg 16 above the selected radial flange is, thus, not needed. As shown in FIG. 9, radial scores 23 are provided to facilitate breakage and subsequent removal of portions of adjustable leg 16 located above the particular radial flange 22 residing in flange seat 48. As shown in FIG. 10, this upper portion can be easily snapped off to leave remaining a low profile, custom fit adjustable leg.

Figure 12:
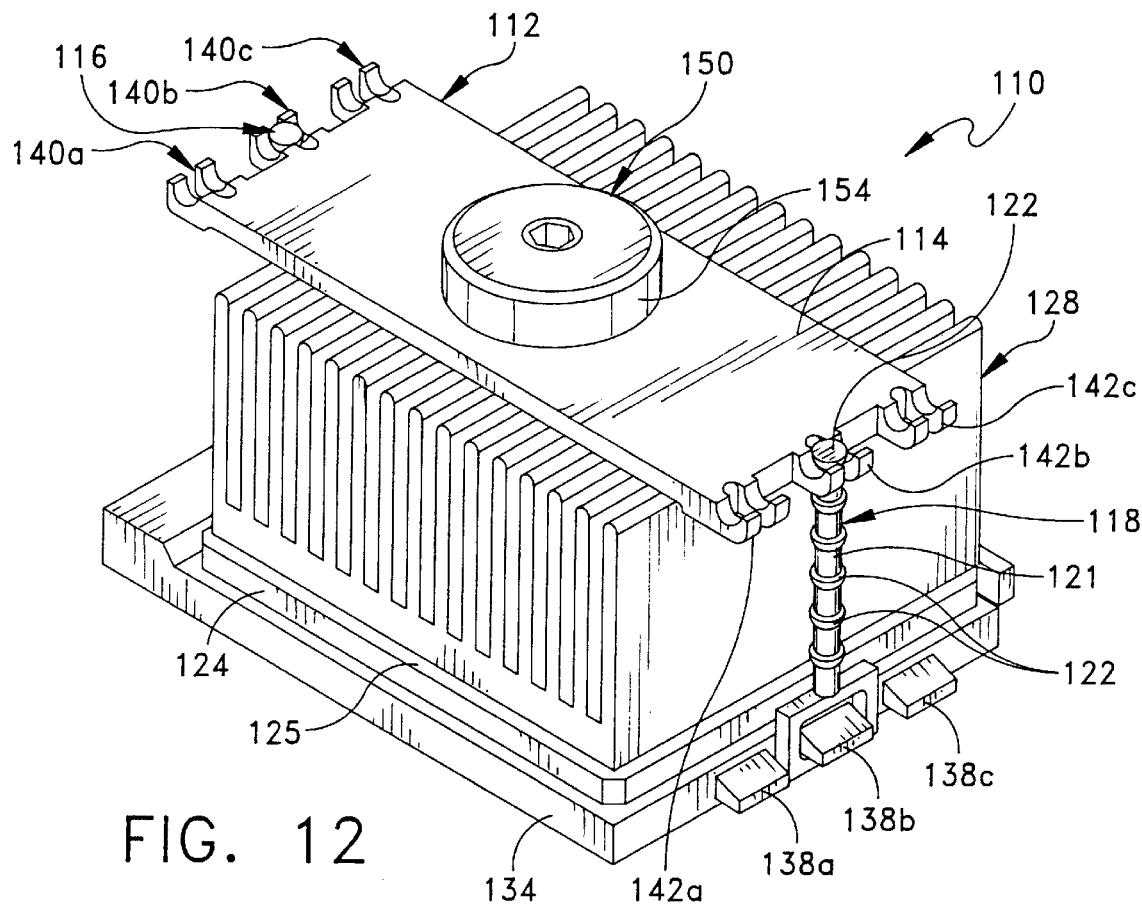
FIG. 12 is a perspective view of an alternative embodiment of a heat sink assembly installed on a socket carrying an electronic device package and employing the adjustable mounting clip in accordance with the present invention.
Figure 13:
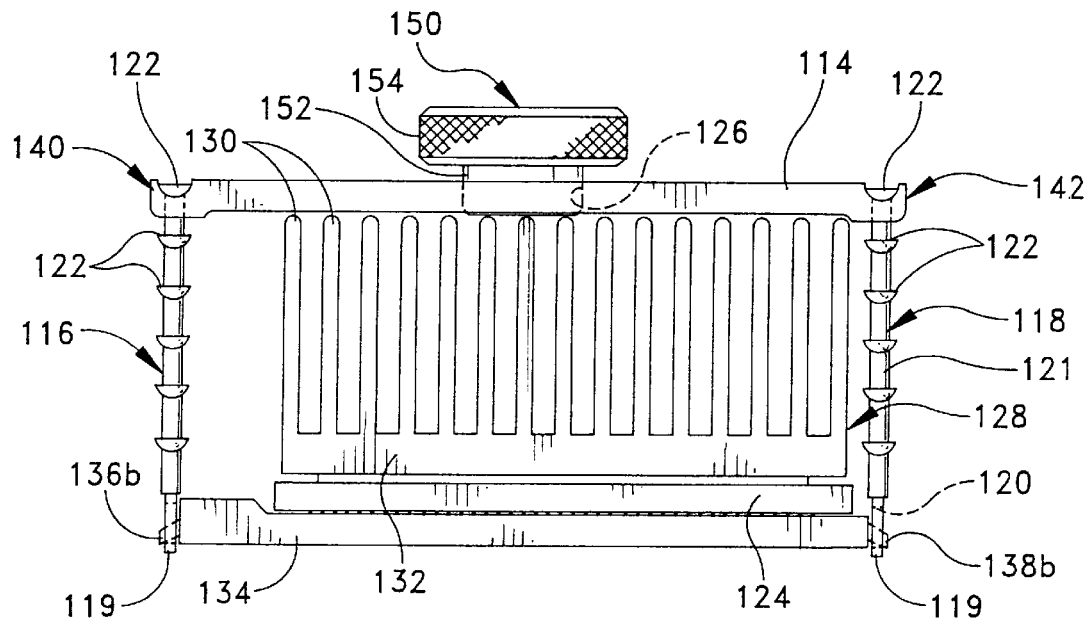
FIG. 13 is a front view of the alternative embodiment shown in FIG. 12.

In contrast to the low profile adjustable legs 16 and 18 shown in FIG. 1, elongated legs may be employed as shown in the alternative embodiment of FIGS. 12 and 13. In this application and heat sink configuration, a block, extruded heat sink 128 is employed to cover virtually the entire top surface 125 of electronic device package 124 which is installed in ZIF socket 134. In this assembly, planar member 114 is provided with female threaded aperture 126 for receiving adjustment member 150 therethrough. Block heat sink 128 includes a base portion 132 in direct contact with electronic device package 124. Adjustable legs 116 and 118 are provided where respective enclosed loops 119 embrace ZIF protrusions 136b and 138b. In this embodiment, the sixth radial flange 122 of leg 116 engages with fork member 140b while the sixth radial flange 122 of leg 118 engages with fork member 142b. The unused portion of legs 116 and 118 have been snapped off and discarded to allow a low profile custom fit adjustable leg to remain. Knob 154 is threaded through aperture 126 to engage with fins 130 to tighten the overall heat sink assembly in place.

Figure 11:
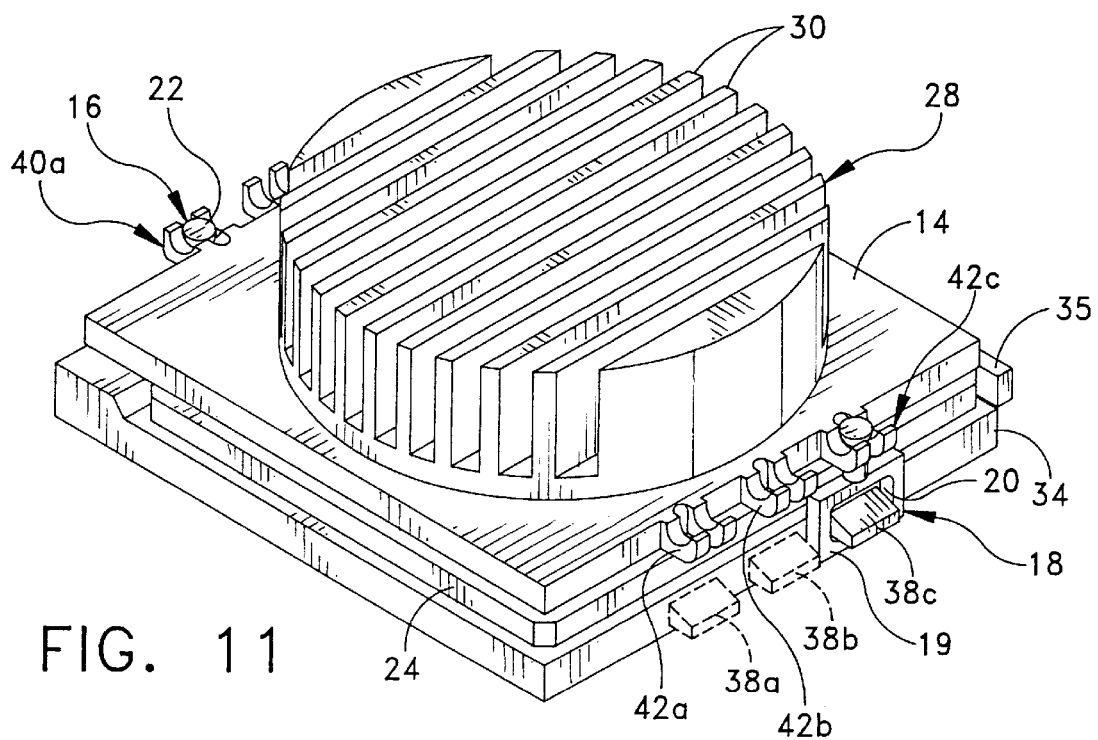
FIG. 11 is a perspective view of a heat sink assembly installed on corner protrusions of a socket carrying an electronic device package and employing the adjustable mounting clip in accordance with the present invention.

Referring now to FIG. 11, the flexibility of the present invention can be shown. ZIF socket 34 is typically provided with protrusions 36a, 36b, and 36c on one side thereof as well as protrusions 38a, 38b, and 38c on the opposing side thereof. The heat sink assembly 10 of the present invention includes a mounting clip 12 which can accommodate any combination of protrusions emanating from ZIF socket 34. In FIG. 11, protrusions 38a and 38b are shown in phantom to illustrate that they may not be present on socket 34. In such a case, it would be necessary to employ fork member 42c and ZIF protrusion 38c to receive adjustable leg 18. If right fork member 42c is employed, it is preferred that the cross-comer fork member 40a be employed to secure to protrusion 38a to balance out the assembly 10 on socket 34. Similarly, if fork member 42a is employed, it is preferred that opposing fork member 40c should be employed. As shown in FIGS. 1 and 12, when central fork member 42b and 142b are employed, the opposing respective central fork members 40b and 140b should also be employed. It is also possible that a particular fork member must be used to avoid contact with another component on the circuit board. Therefore, the preferred embodiment and the alternative embodiment of the present invention may selectively relocate the adjustable legs to accommodate the particular application and environment at hand. As a result of the foregoing, mounting clip 12 of the present invention can be easily customized to adapt the heat sink assembly to any circuit board environment and any size or configuration of heat sink member to be employed to cool the electronic device package 24.

It is preferred that the entire mounting clip 12 be manufactured of plastic material, such as a high temperature resistant and high creep resistant plastic for better withstanding the high temperatures associated with microprocessors. For example, the plastic material for mounting clip 12 may be LNP VERTON UF-700-10-HS (P.P.A. 50% long fiber) for use in high temperate heat sink applications. In addition, heat sink member 28 is preferably metal, such as aluminum, for optimum thermal transfer and dissipation of heat from integrated circuit 25. As shown in FIGS. 1 and 12, upstanding fins 30 are provided but various other heat sink fin configurations may be employed.

It would be appreciated by those skilled in the art that various changes and modifications can be made to the illustrated embodiments without departing from the spirit of the present invention. All such modifications and changes are intended to be covered by the appended claims.

What is claimed is:

1. A heat sink assembly for removing heat from an electronic device package installed in a socket having protrusions emanating therefrom, comprising:

a top planar member with a first end and a second end opposing said first end;

a first leg removably connected to and downwardly depending from said first end of said top member; said first leg including a first elongated shaft member, with an upper and bottom end, having a plurality of spaced apart radial flanges along its length; first engagement element affixed to said bottom end of said first elongated shaft member for securing said first leg to one of said protrusions emanating from said socket; said first leg being removably connected to said first end of said top planar member via one of said radial flanges;

a second leg removably connected to and downwardly depending from said second end of said top planar member; said second leg including a second elongated shaft member, with an upper and bottom end, having a plurality of spaced apart radial flanges along its length; second engagement element affixed to said bottom end of said second elongated shaft member for securing said second leg to one of said protrusions emanating from said socket; said second leg being removably connected to said second end of said top planar member via one of said radial flanges;

a heat sink member disposed in communication with said electronic device package; said heat sink member having a flat bottom surface;

heat sink member being adjustably connected to said top planar member for maintaining said heat sink member in flush thermal communication with said electronic device package installed in said socket;

whereby connection of said first end of said top planar member to a selected one of said radial flanges on said first leg and connection of said second end of said top planar member to a selected one of said radial flanges on said second leg defines a distance between said top planar member and said electronic device package to accommodate said heat sink member.

2. The heat sink assembly of claim 1, wherein a portion of said first elongated shaft of said first leg above a radial flange removably connected to said first end of said top planar member is severable from said first elongated shaft.

3. The heat sink assembly of claim 1, wherein a portion of said second elongated shaft of said second leg above a radial flange removably connected to said second end of said top planar member is severable from said second elongated shaft.

4. The heat sink assembly of claim 1, wherein said heat sink member being adjustably connected to said top planar member for maintaining said heat sink member in flush thermal communication with said electronic device package, said top planar member having female threading disposed about a bore through and defined by said top planar member and said heat sink member with male threading about its circumference; said heat sink member being threadable through said bore, via engagement with said female threading, to provide said flat bottom surface of said heat sink member into communication with said electronic device package.

5. The heat sink member of claim 1, wherein said heat sink member being adjustably connected to said top planar member for maintaining said heat sink member in flush thermal communication with said electronic device package, said top planar member having female threading disposed about a bore through and defined by said top planar member, a cylindrical adjustment member, having male threading thereon and threadably received through said bore into communication with an upper surface of said heat sink member residing between said top planar member and said electronic device package; said adjustment member maintaining said heat sink member in thermal communication with said electronic device package.

6. The heat sink assembly of claim 1, further comprising:

at least one first fork member connected to and emanating outwardly from said first end of said top planar member; each of said at least one first fork member being capable of removably engaging with one of said radial flanges of said first elongated shaft member; and at least one second fork member connected to and emanating outwardly from said second end of said top planar member; each of said at least one second fork member being capable of removably engaging with one of said radial flanges of said second elongated shaft member.

7. The heat sink assembly of claim 1, wherein said first and second engagement elements enclosed loops affixed to said bottom end of said first and second shaft member.

8. The heat sink assembly of claim 1, wherein said first leg and said second leg are manufactured of plastic.

9. A heat sink assembly for removing heat from an electronic device package installed in a socket having protrusions emanating therefrom, comprising:

a top planar member with a first end and a second end opposing said first end;

a first fork member connected to and emanating outwardly from said first end of said top planar member;

a second fork member connected to and emanating outwardly from said second end of said top planar member;

a first leg removably connected to said first fork member and downwardly depending from said first end of said top member; said first leg including a first elongated shaft member, with an upper and bottom end, having a plurality of spaced apart radial flanges along its length; a first enclosed loop affixed to said bottom end of said first elongated shaft member; said first enclosed loop being engageable with one of said protrusions emanating from said socket; said first leg being removably connected to said first end of said top planar member via engagement of a selected one of said radial flanges with said first fork member;

a second leg removably connected to said second fork member and downwardly depending from said second end of said top planar member; said second leg including a second elongated shaft member, with an upper and bottom end, having a plurality of spaced apart radial flanges along its length; a second enclosed loop affixed to said bottom end of said second elongated shaft member; said second enclosed loop being engageable with one of said protrusions emanating from said socket; said second leg being removably connected to said second end of said top planar member via engagement of a selected one of said radial flanges with said second fork member;

a heat sink member disposed in communication with said electronic device package; said heat sink member having a flat bottom surface;

said heat sink being adjustably connected to said top planar member for maintaining said heat sink member in flush thermal communication with said electronic device package installed in said socket;

whereby connection of said first end of said top planar member to a selected one of said radial flanges on said first leg and connection of said second end of said top member to a selected one of said radial flanges on said second leg defines a distance between said top planar member and said electronic device package to accommodate said heat sink member.

10. The heat sink assembly of claim 9, wherein a portion of said first elongated shaft of said first leg above a radial flange removably connected to said first end of said top planar member is severable from said first elongated shaft.

11. The heat sink assembly of claim 9, wherein a portion of said second elongated shaft of said second leg above a radial flange removably connected to said second end of said top planar member is severable from said second elongated shaft.

12. The heat sink assembly of claim 9, wherein said heat sink member being adjustably connected to said top planar member for maintaining said heat sink member in flush thermal communication with said electronic device package, said top planar member having female threading disposed about a bore through and defined by said top planar member and said heat sink member with male threading about its circumference; said heat sink member being threadable through said bore, via engagement with said female threading, to provide said flat bottom surface of said heat sink member into communication with said electronic device package.

13. The heat sink member of claim 9, wherein said heat sink member being adjustably connected to said top planar member for maintaining said heat sink member in flush thermal communication with said electronic device package, said top planar member having female threading disposed about a bore through and defined by said top planar member, a cylindrical adjustment member, having male threading thereon and threadably received through said bore into communication with an upper surface of said heat sink member residing between said top planar member and said electronic device package; said adjustment member maintaining said heat sink member in thermal communication with said electronic device package.

14. The heat sink assembly of claim 1, wherein said first leg and said second leg are manufactured of plastic.

15. A heat sink assembly for removing heat, comprising:

an electronic device socket having a first end, an opposing second end; a plurality of first protrusions laterally emanating from said first end of said electronic device socket; a plurality of second protrusions laterally emanating from said second end of said electronic device socket;

an electronic device package installed in said electronic device socket; said electronic device package having a top surface;

a top planar member with a first end and a second end opposing said first end;

a first fork member connected to and emanating outwardly from said first end of said top planar member;

a second fork member connected to and emanating outwardly from said second end of said top planar member;

a first leg removably connected to said first fork member and downwardly depending from said first end of said top planar member; said first leg including a first elongated shaft member, with an upper and bottom end, having a plurality of spaced apart radial flanges along its length; a first enclosed loop affixed to said bottom end of said first elongated shaft member; said first enclosed loop being engageable with one of said plurality of first protrusions laterally emanating from first end of said electronic device socket; said first leg being removably connected to said first end of said top planar member via engagement of a selected one of said radial flanges with said first fork member;

a second leg removably connected to said second fork member and downwardly depending from said second end of said top planar member; said second leg including a second elongated shaft member, with an upper and bottom end, having a plurality of spaced apart radial flanges along its length; a second enclosed loop affixed to said bottom end of said second elongated shaft member; said second enclosed loop being engageable with one of said plurality of second protrusions laterally emanating from said second end of said electronic device socket; said second leg being removably connected to said second end of said top planar member via engagement of a selected one of said radial flanges with said second fork member;

a heat sink member disposed in communication with said electronic device package; said heat sink member having a flat bottom surface engageable with said top surface of said electronic device package;

said top planar member being positioned above said heat sink member; a knob member adjustably connected to top planar member for maintaining said heat sink member in flush thermal communication with said electronic device package installed in said socket;

whereby connection of said first end of said top member to a selected one of said radial flanges on said first leg via said first fork member and connection of said second end of said top planar member to a selected one of said radial flanges on said second leg via said second fork member defines a distance between said top planar member and said electronic device package to accommodate said heat sink member.

* * * * *